US007298625B1

(12) United States Patent
Wu et al.

(10) Patent No.: US 7,298,625 B1
(45) Date of Patent: Nov. 20, 2007

(54) EXPANSION STRUCTURE OF MEMORY MODULE SLOT

(75) Inventors: Fu-Chung Wu, Taipei (TW); Sheng-Yuan Tsai, Taipei (TW); Shih-Jui Tung, Taipei (TW)

(73) Assignee: Inventec Corporation, Taipei (TW)

( * ) Notice: Subject to any disclaimer, the term of this patent is extended or adjusted under 35 U.S.C. 154(b) by 0 days.

(21) Appl. No.: 11/653,932

(22) Filed: Jan. 17, 2007

(51) Int. Cl.
*H05K 7/02* (2006.01)
*H05K 7/10* (2006.01)

(52) U.S. Cl. .............. 361/735; 361/736; 361/760; 361/781; 361/803; 174/261; 257/723; 257/686; 365/51

(58) Field of Classification Search .......... 361/736, 361/796, 735, 728, 729, 731, 760, 781, 803, 361/807, 808; 257/686, 723; 365/51, 63
See application file for complete search history.

(56) References Cited

U.S. PATENT DOCUMENTS

| 3,949,274 | A | * | 4/1976 | Anacker | 361/735 |
| 4,838,798 | A | * | 6/1989 | Evans et al. | 439/61 |
| 5,335,146 | A | * | 8/1994 | Stucke | 361/785 |
| 5,754,405 | A | * | 5/1998 | Derouiche | 361/744 |
| 5,825,631 | A | * | 10/1998 | Prchal | 361/790 |
| 6,049,467 | A | * | 4/2000 | Tamarkin et al. | 361/790 |
| 6,246,588 | B1 | * | 6/2001 | Kim et al. | 361/786 |
| 6,388,886 | B1 | * | 5/2002 | Tobita | 361/760 |
| 6,392,142 | B1 | * | 5/2002 | Uzuka et al. | 174/541 |
| 6,690,584 | B2 | * | 2/2004 | Uzuka et al. | 361/796 |
| 6,853,557 | B1 | * | 2/2005 | Haba et al. | 361/760 |
| 7,193,861 | B2 | * | 3/2007 | Uzuka et al. | 361/786 |
| 7,200,023 | B2 | * | 4/2007 | Foster, Sr. | 365/63 |

* cited by examiner

*Primary Examiner*—Tuan T. Dinh
*Assistant Examiner*—Dameon E. Levi
(74) *Attorney, Agent, or Firm*—Rabin & Berdo, P.C.

(57) ABSTRACT

An expansion structure of memory module slots is provided. A circuit switch board and a substrate are disposed on a motherboard, wherein a plurality of first memory module slots is disposed on the motherboard, at least one second memory module slot is disposed on one side of the substrate, and a plurality of third memory module slots is disposed on the other side of the substrate. The third memory module slots are electrically connected to the second memory module slot, and two ends of the circuit switch board are plugged into one of the first memory module slots and the second memory module slot. When memory modules are plugged in the third memory module slots, the memory modules are electrically connected to the first memory module slots respectively through the circuit switch board and then transmit data and signals with the motherboard.

6 Claims, 4 Drawing Sheets

EXPANSION STRUCTURE OF MEMORY MODULE SLOT

BACKGROUND OF THE INVENTION

1. Field of Invention

The present invention relates to an expansion structure of memory module slots, and more particularly, to an expansion structure of memory module slots that is capable of assembling more memory modules onto a motherboard.

2. Related Art

A central processing unit (CPU) of a computer host takes a random access memory (RAM) as a data storage area. Computing results and program instructions of the CPU are all stored in the RAM, and the data stored in the storage area is available once it is required by executing a program.

Currently, the computer host has more and more powerful functions, and accordingly, the requirement for the calculation function is increasingly high, and thus, more RAMs are demanded. FIG. 1A is a side view of a memory module being plugged in a motherboard, and FIG. 1B is a schematic isometric view of the memory module. Referring to FIGS. 1A and 1B, a north bridge chip 21a and a plurality of memory module slots 22a adjacent to the north bridge chip 21a are disposed on a motherboard 20a. Memory modules 50a may be plugged in the memory module slots 22a by golden fingers. Each of the memory modules 50a further includes a printed circuit board (PCB) 51a and a plurality of memories 52a, and the memories 52a are respectively disposed on two end surfaces of the PCB 51a. The north bridge chip 21a is mainly used to control the signal transmission between the CPU and the memory modules 50a.

Therefore, under the current situation of increasing data processing speed and increasing large data quantity for being processed, the capacity of the corresponding memory modules also becomes higher, and meanwhile, more memory module slots are required for more memory modules to be plugged in. However, the memory module slots are directly disposed on the surface of the motherboard, and thus, if more memory modules are intended to be assembled, more memory module slots have to be disposed on the surface of the motherboard, and thereby occupying more area of the motherboard. Under the limited assembling area of the motherboard, the assembling of other electronic elements is affected. On the other hand, the area of the motherboard must be enlarged to accommodate more memory module slots, which, however, causes an increase in the volume of the computer host, and thereby running against the trend for the computer host to become light in weight and small in size.

SUMMARY OF THE INVENTION

In the prior art, to increase the capacity of the memory modules, the number of the memory module slots disposed on the surface of the motherboard must be increased, thereby occupying more area of the motherboard. In view of the aforementioned problem, the present invention is directed to providing an expansion structure of memory module slots, which expands the capacity of the memory modules without occupying more assembling area of the motherboard.

The expansion structure of memory module slots provided by the present invention is applicable for a motherboard having a plurality of first memory module slots. The expansion structure of memory module slots comprises a circuit switch board and a substrate. Two ends of the circuit switch board are respectively formed into a first connecting terminal and a second connecting terminal that are conducted to each other, wherein the first connecting terminal is electrically connected to one of the first memory module slots. At least one second memory module slot is disposed on one side of the substrate, and a plurality of third memory module slots is disposed on the other side of the substrate, wherein the third memory module slots are electrically connected to the second memory module slot, and the second connecting terminal of the circuit switch board is electrically connected to the second memory module slot, such that a plurality of memory modules is respectively connected to each of the third memory module slots, and then electrically connected to the first memory module slots via the circuit switch board, thereby performing signal transmission with the motherboard.

The expansion structure of memory module slots provided by the present invention has the efficacies as follows. The memory modules are expanded within a limited space without occupying more assembling area of the motherboard, which not only significantly reduces the surface area of the motherboard occupied by the memory modules, but also makes full use of the memory modules. The memory modules are stacked on the motherboard through the circuit switch board and the substrate, so the memory modules may be expanded upon a user's requirements. Furthermore, besides functioning as a holder for the substrate, the circuit switch board may also be used as a connecting channel between the motherboard and the substrate, without requiring additional connectors, and thereby reducing the manufacturing cost.

Further scope of applicability of the present invention will become apparent from the detailed description given hereinafter. However, it should be understood that the detailed description and specific examples, while indicating preferred embodiments of the invention, are given by way of illustration only, since various changes and modifications within the spirit and scope of the invention will become apparent to those skilled in the art from this detailed description.

BRIEF DESCRIPTION OF THE DRAWINGS

The present invention will become more fully understood from the detailed description given herein below for illustration only, which thus is not limitative of the present invention, and wherein.

DETAILED DESCRIPTION OF THE INVENTION

In the expansion structure of memory module slots according to the present invention, the types of the memory modules include, but are not limited to, for example, single in-line memory modules (SIMM), dual in-line memory modules (DIMM), rambus in-line memory modules (RIMM). In the following specific embodiments of the present invention, the dual in-line memory modules (DIMM) are taken as a preferred embodiment of the present invention.

Figure 1A:
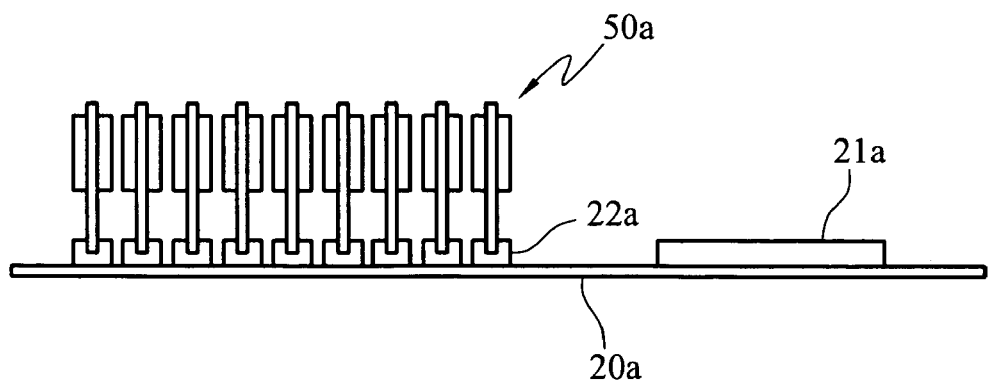
FIG. 1A is a side view of a conventional memory module being plugged in a motherboard.
Figure 1B:
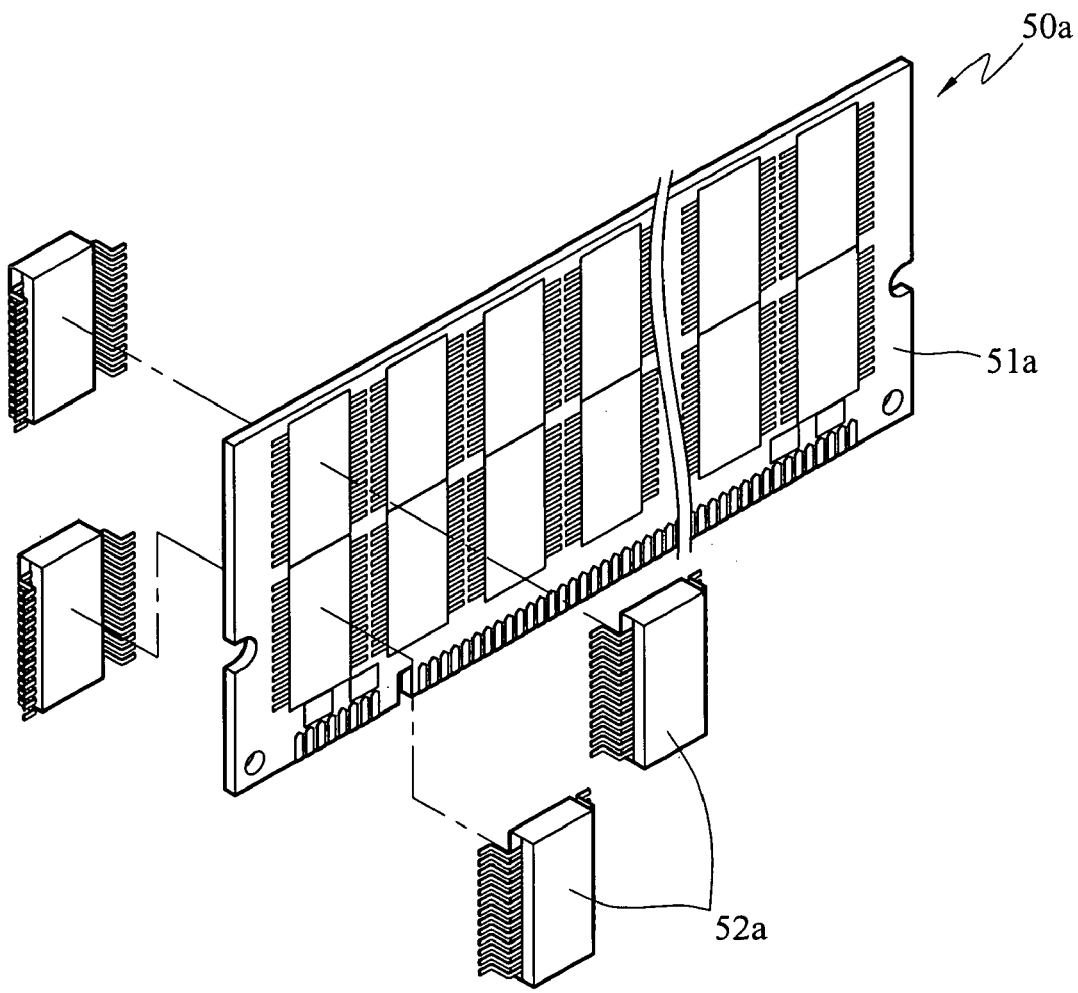
FIG. 1B is a schematic isometric view of the conventional memory module.
Figure 2A:
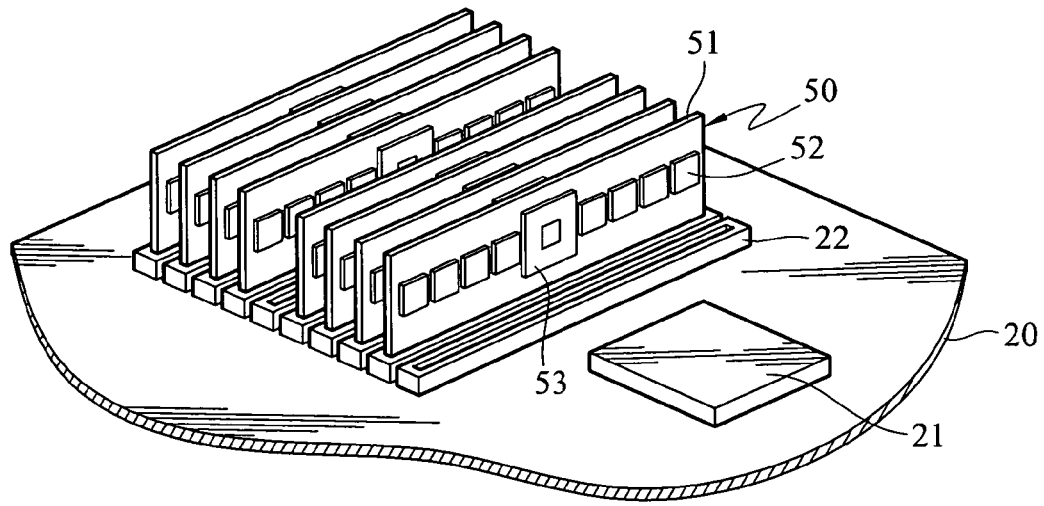
FIG. 2A is a schematic isometric view of an embodiment of the present invention without a memory expansion card.
Figure 2B:
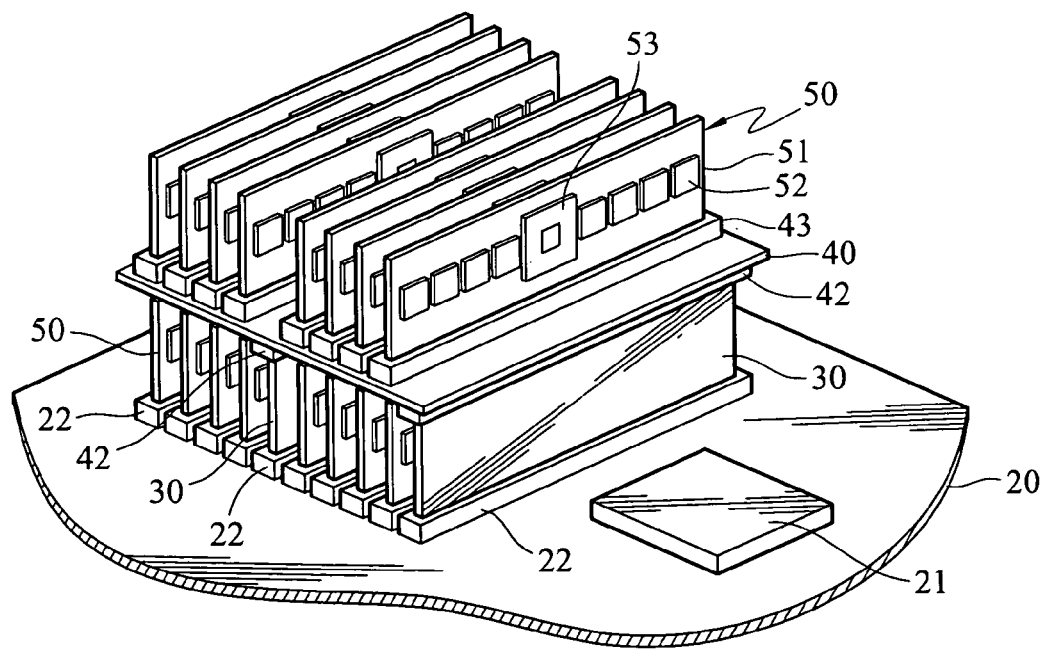
FIG. 2B is a schematic isometric view of an embodiment of the present invention with a memory expansion card.
Figure 3:
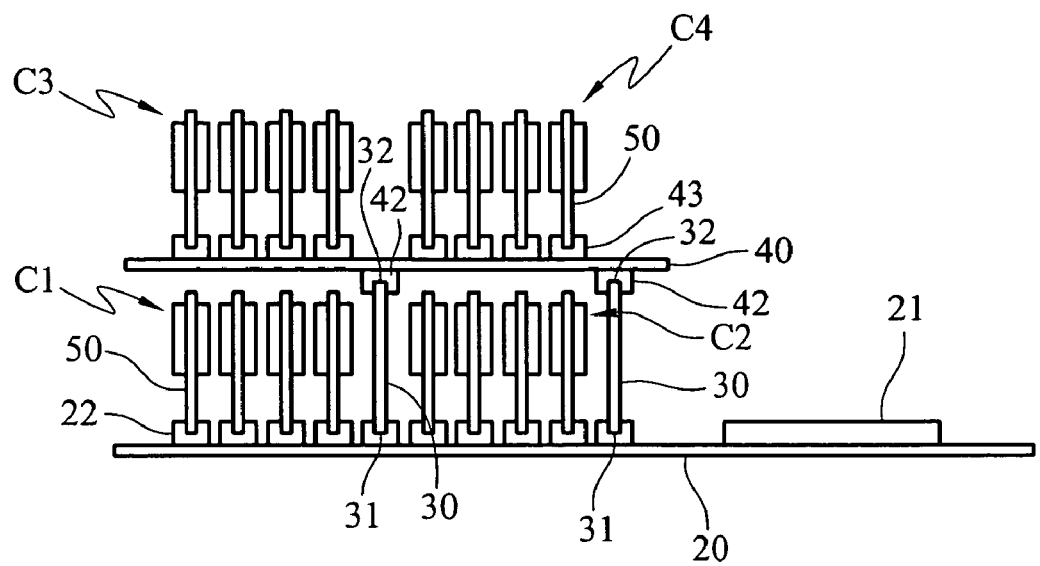
FIG. 3 is a schematic side view of an embodiment of the present invention with a memory expansion card.

Referring to FIGS. 2A, 2B, and 3, FIG. 2A is a schematic isometric view of an embodiment of the present invention without a memory expansion card, FIG. 2B is a schematic isometric view of the embodiment of the present invention with the memory expansion card, and FIG. 3 is a schematic side view of the embodiment of the present invention with the memory expansion card. The expansion structure of memory module slots is applicable for a motherboard 20 and includes a circuit switch board 30 and a substrate 40. Furthermore, the motherboard 20 is disposed with a CPU, a north bridge chip 21, and other electronic components. A plurality of first memory module slots 22 is disposed adjacent to the north bridge chip 21, wherein fully buffered DIMMs 50 are plugged in the first memory module slots 22 by golden fingers. Each of the fully buffered DIMMs 50 further includes a circuit board 51, a plurality of memories 52, and an advanced memory buffer (AMB) 53, wherein the memories 52 are respectively disposed on the two side surfaces of the circuit board 51, and the advanced memory buffer (AMB) 53 is also disposed on one end surface of the circuit board 51. Additionally, the north bridge chip 21 mainly controls the signal transmission between the CPU and each of the fully buffered DIMMs 50. In this manner, the CPU executes a program, and stores and reads data into or from a storage area at any time.

The circuit switch board 30 is a PCB with a signal transmission line, and the two ends of the circuit switch board 30 are formed into a first connecting terminal 31 and a second connecting terminal 32 that are conducted to each other, wherein the first connecting terminal 31 is plugged in one of the first memory module slots 22 on the motherboard 20, and the second connecting terminal 32 is extended away from the motherboard 20 to support the substrate 40, thereby making the substrate 40 be electrically conducted with the motherboard 20. The number of the circuit switch boards 30 is mainly as small as possible, as long as the circuit switch boards 30 firmly support the substrate 40 on the motherboard 20, and thereby preventing the substrate 40 from falling down. In this embodiment, the number of the circuit switch boards 30 is two, but it is not limited to this.

At least one second memory module slot 42 is disposed on one side of the substrate 40, and a plurality of third memory module slots 43 is disposed on the other side of the substrate 40 and electrically connected to the second memory module slot, wherein the second memory module slot 42 on the substrate 40 is corresponding to the second connecting terminal 32 of the circuit switch board 30, thereby being electrically connected to the second connecting terminal of the circuit switch board 30, and each of the third memory module slots 43 is provided for each of the fully buffered DIMMs 50 to be plugged in by golden fingers. Herein, the number of the second memory module slots 42 is two, but which is not limited to this, and each of the second memory module slots 42 is corresponding to a set of the third memory module slots 43.

Figure 4:
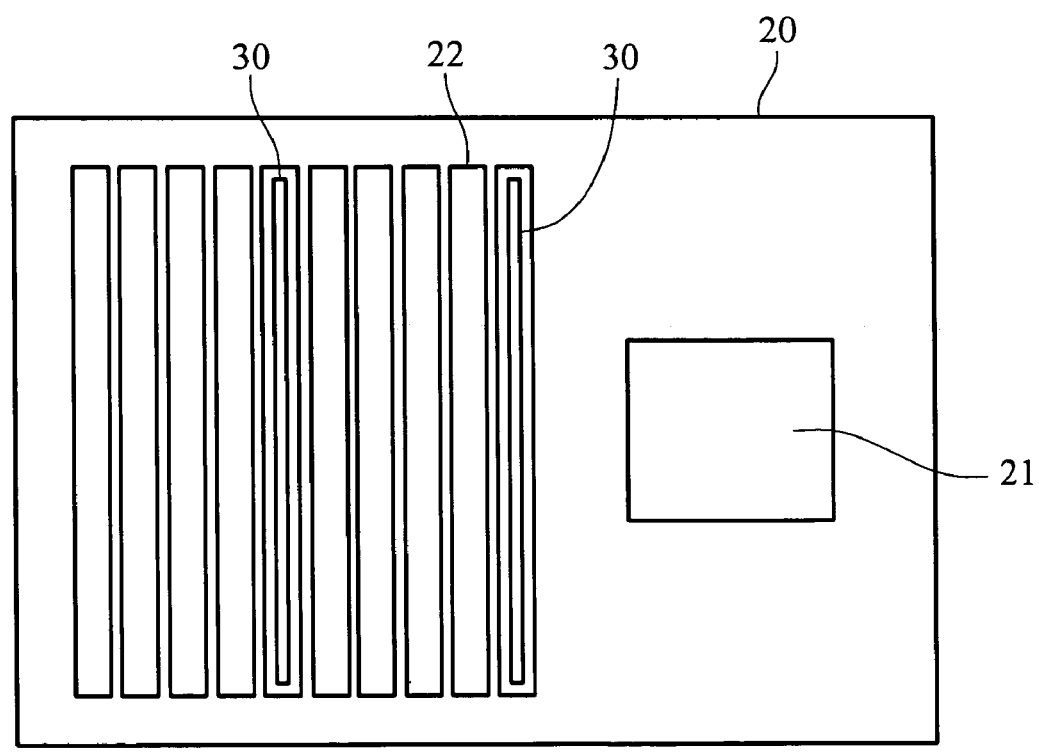
FIG. 4 is a schematic top view of a circuit switch board being plugged in first memory module slots according to an embodiment of the present invention.
Figure 5:
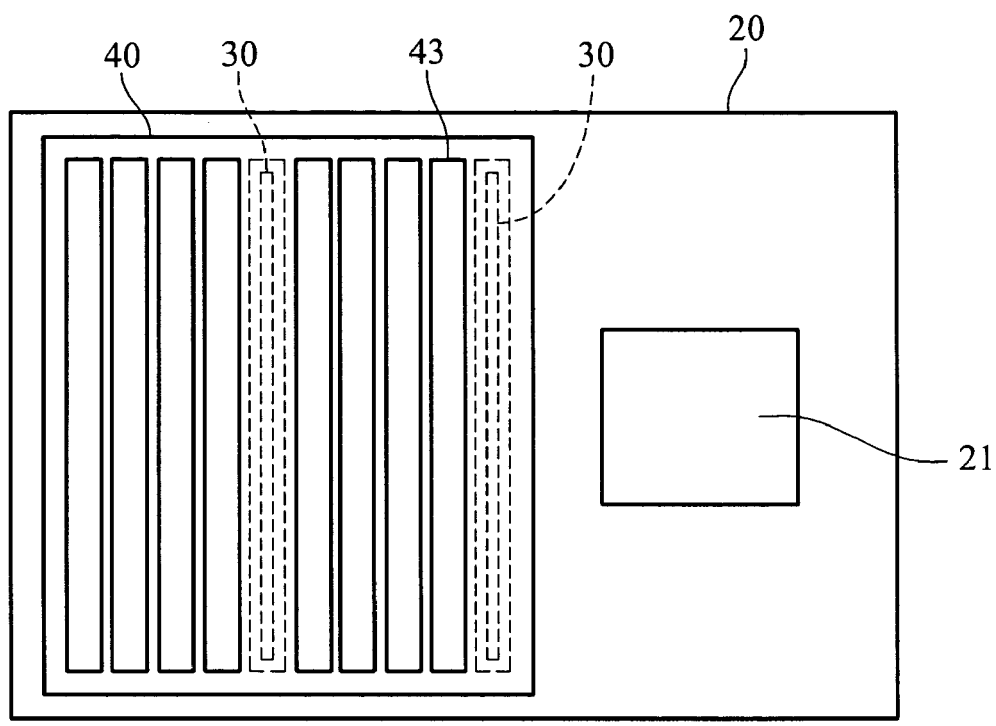
FIG. 5 is a schematic top view of the circuit switch board being plugged in third memory module slots according to an embodiment of the present invention.
Figure 6:
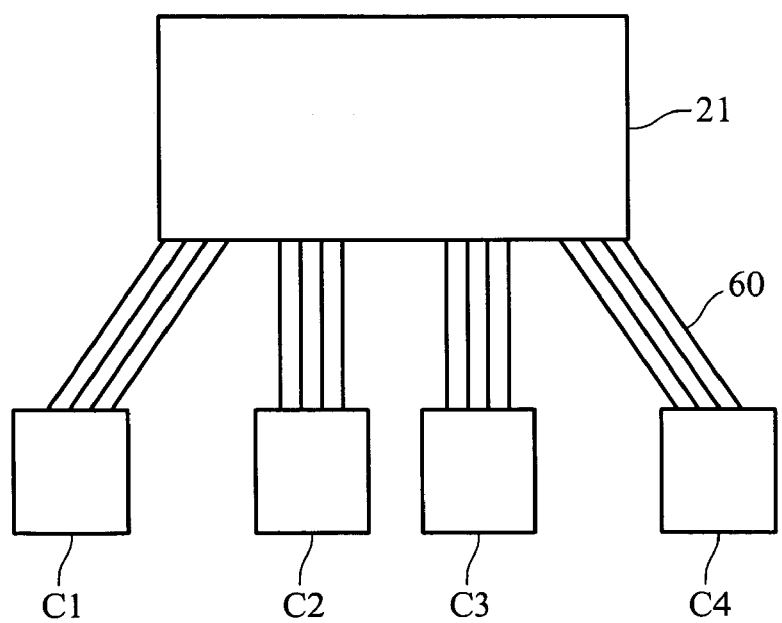
FIG. 6 is a schematic view of the signal transmission between a north bridge chip and a fully buffered DIMM through a bus according to an embodiment of the present invention.

Referring to FIGS. 2A, 2B, and 3, together with FIGS. 4, 5, and 6, FIG. 4 is a schematic top view of the circuit switch boards being plugged in the first memory module slots, FIG. 5 is a schematic top view of the circuit switch boards being plugged in the third memory module slots, and FIG. 6 is a schematic view of the signal transmission between the north bridge chip and each of the fully buffered DIMMs through a bus. According to the aforementioned means, during an assembling process, the first connecting terminal 31 of the circuit switch board 30 is plugged in one of the first memory module slots 22 of the motherboard 20 to serve as a holder for the substrate 40. Then, the second memory module slot 42 of the substrate 40 is aligned with the second connecting terminal 32 of the circuit switch board 30, and makes the second connecting terminal 32 be plugged in, and thus, they are electrically connected with each other. Therefore, the substrate 40 and the motherboard 20 are parallel to each other and spaced apart by a spacing distance. In this manner, the substrate 40 is supported and stacked above the first memory module slots 22 of the motherboard 20. The first memory module slots 22 and the third memory module slots 43 are provided for an operator to plug the fully buffered DIMMs 50 therein. Herein, there are eight fully buffered DIMMs 50 in this embodiment, which are divided into four sets according to positions, namely, the first set C1, the second set C2, the third set C3, and the fourth set C4, wherein two sets C1 and C2 of the fully buffered DIMMs 50 are plugged in the first memory module slots 22, and two sets C3 and C4 of the fully buffered DIMMs 50 are plugged in the third memory module slots 43, but the numbers are not limited that. The operator plugs the fully buffered DIMMs 50 in the first memory module slots 22 and the third memory module slots 43 by golden fingers depending upon the required number of fully buffered DIMMs 50.

In practical application, the north bridge chip 21 transmits a signal to the sets C1, C2, C3, and C4 through the bus 60, i.e., all the fully buffered DIMMs 50 plugged in the first memory module slots 22 and the third memory module slots 43 can receive the signal. However, due to different positions of the fully buffered DIMMs 50, the signal transmission paths are also different, wherein the paths between the bus 60 and the sets C1 and C2 merely pass through the motherboard 20, whereas the paths between the bus 60 and the sets C3 and C4 pass through the motherboard 20 and then reach the third memory module slots 43 through two circuit switch boards 30 respectively. Therefore, the fully buffered DIMMs 50 plugged in the third memory module slots 43 is capable of transmitting data and signals with the north bridge chip 21 on the motherboard 20.

It should be noted that, the height of the circuit switch board 30 should be determined in consideration of the space arrangement within the computer host. For example, when the first connecting terminal 31 and the second connecting terminal 32 of the circuit switch board 30 are plugged in one of the first memory module slots 22 and the second memory module slot 42, the spacing distance between the substrate 40 and the motherboard 20 must be larger than the height of the fully buffered DIMMs 50 after being plugged in the first memory module slots 22, so as to prevent the substrate 40 from pressing and impacting the fully buffered DIMMs 50 plugged in the first memory module slots 22 and then causing damage.

In a similar way, according to the above assembling steps, another substrate may be stacked above the substrate 40 in a direction away from the motherboard 20, so as to satisfy the operator's requirements.

To sum up, in the present invention, the capacity of the memory modules is enlarged by means of stacking upwards. If the capacity of the memory modules is insufficient or to cater to the operator's requirements, another substrate is mounted on an area of the motherboard disposed with the memory modules through the circuit switch board, so as to accommodate more memory modules. In this manner, more memory module slots may be disposed on the motherboard, without adding additional assembling area, and the memory module slots are disposed in such a way that they occupy less area of the motherboard, thereby greatly reducing the occupied area of the motherboard. Furthermore, the operator only needs to plug the two ends of the circuit switch board into the original memory module slots, so as to electrically connect the substrate to the motherboard, and thereby transmitting data therebetween, without requiring other connectors, and thus the cost is saved. Furthermore, under the circumstance of the limited usable area of the motherboard, the process of expanding the memory modules towards above the motherboard also achieves an optimal effect of the memory modules.

The invention being thus described, it will be obvious that the same may be varied in many ways. Such variations are not to be regarded as a departure from the spirit and scope of the invention, and all such modifications as would be obvious to one skilled in the art are intended to be included within the scope of the following claims.

What is claimed is:

1. An expansion structure of memory module slots, applicable for a motherboard having a plurality of first memory module slots, comprising:
   a circuit switch board, with two ends forming into a first connecting terminal and a second connecting terminal that are conducted to each other, wherein the first connecting terminal is electrically connected to one of the first memory module slots; and
   a substrate, with at least one second memory module slot disposed on one side of the substrate, and a plurality of third memory module slots disposed on other side of the substrate, wherein the third memory module slots are electrically connected to the second memory module slot, and the second connecting terminal of the circuit switch board is electrically connected to the second memory module slots;
   wherein, memory modules are respectively connected to the third memory module slots, and electrically connected to the first memory module slots through the circuit switch board, thereby performing signal transmission with the motherboard.

2. The expansion structure of memory module slots as claimed in claim 1, wherein two ends of the circuit switch board are respectively plugged in one of the first memory module slots and the second memory module slot.

3. The expansion structure of memory module slots as claimed in claim 1, wherein the substrate is parallel to the motherboard and spaced apart by a spacing distance.

4. The expansion structure of memory module slots as claimed in claim 3, wherein the spacing distance is larger than a height of the memory modules after being plugged in the first memory module slots.

5. The expansion structure of memory module slots as claimed in claim 1, wherein the circuit switch board is a printed circuit board with a signal transmission line.

6. An expansion structure, comprising:
   a motherboard having at least one first memory module slot disposed on a surface thereof;
   a circuit switch board, having a first connecting terminal at a first edge thereof, and a second connecting terminal at a second edge thereof, the first edge being opposite and parallel to the second edge, the first connecting terminal being electrically connected to the second connecting terminal, the first connecting terminal being electrically received within the first memory module slot, so that the circuit switch board is essentially perpendicular to the surface of the motherboard;
   a substrate having first and second opposing surfaces, with at least one second memory module slot disposed on the first surface, and at least one third memory module slot disposed on the second surface, wherein the third memory module slot is electrically connected to the second memory module slot, and the second connecting terminal of the circuit switch board is electrically received within the second memory module slot, so that the substrate is essentially perpendicular to the circuit switch board, and essentially parallel to the surface of the motherboard; and
   at least one memory module electrically received within the third memory module slot, and being electrically connected to the first memory module slot through the circuit switch board, thereby performing signal transmission with the motherboard, the memory module being essentially perpendicular to the second surface of the substrate.

* * * * *